United States Patent
Trotman et al.

(10) Patent No.: US 11,606,871 B2
(45) Date of Patent: Mar. 14, 2023

(54) METHODS OF PROTECTING VENT/DRAIN FEATURES IN ELECTRONIC ASSEMBLIES

(71) Applicant: Hamilton Sundstrand Corporation, Charlotte, NC (US)

(72) Inventors: Kenneth J. Trotman, Granby, CT (US); Rachel Welsh, North Granby, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 57 days.

(21) Appl. No.: 17/213,095

(22) Filed: Mar. 25, 2021

(65) Prior Publication Data

US 2021/0219444 A1    Jul. 15, 2021

Related U.S. Application Data

(62) Division of application No. 15/823,262, filed on Nov. 27, 2017, now Pat. No. 10,986,742.

(51) Int. Cl.
*H05K 5/02* (2006.01)
*F16K 24/04* (2006.01)

(52) U.S. Cl.
CPC ........... *H05K 5/0213* (2013.01); *F16K 24/04* (2013.01)

(58) Field of Classification Search
CPC ......... H05K 5/0213; F24F 13/20; F16K 24/04
USPC ................................. 454/184, 367
See application file for complete search history.

(56) References Cited

U.S. PATENT DOCUMENTS

| 4,451,258 A | * | 5/1984 | Jensen ................... A61F 5/441 |
| | | | 55/385.4 |
| 4,889,160 A | | 12/1989 | Sheets |
| 5,095,410 A | | 3/1992 | Nagengast et al. |
| 7,959,026 B2 | | 6/2011 | Bertani |
| 2004/0013936 A1 | | 1/2004 | Barrett, Jr. |
| 2014/0041520 A1 | * | 2/2014 | Daimon ............... H05K 5/0213 |
| | | | 96/4 |
| 2016/0113131 A1 | | 4/2016 | Ernesti et al. |

FOREIGN PATENT DOCUMENTS

EP    2704542 A1    3/2014

OTHER PUBLICATIONS

Extended European Search Report dated Mar. 20, 2019, issued during the prosecution of European Patent Application No. EP 2704542 (8 pages).

* cited by examiner

*Primary Examiner* — Ko-Wei Lin
(74) *Attorney, Agent, or Firm* — Locke Lord LLP; Joshua L. Jones; Gabrielle L. Gelozin

(57) ABSTRACT

A vent/drain cover for an electronics enclosure includes a cover body defining an axis and a surface with a first wall protruding from the surface in a direction and a second wall protruding from the surface in the same direction but displaced radially from the first wall. The first wall has a first channel formed therein that is defined by a portion of the first wall that does not extend as far from the surface as the balance of the first wall. The second wall has a second channel defined by a portion of the second wall that does not extend as far from the surface as the balance of the second wall, the first channel being circumferentially offset from the second channel. Electronics enclosures and methods of venting electronics assemblies are also described.

2 Claims, 6 Drawing Sheets

METHODS OF PROTECTING VENT/DRAIN FEATURES IN ELECTRONIC ASSEMBLIES

CROSS-REFERENCE TO RELATED APPLICATION

This application is a divisional application of U.S. patent application Ser. No. 15/823,262 filed on Nov. 27, 2017, which is incorporated herein by reference in its entirety.

BACKGROUND OF THE INVENTION

1. Field of the Invention

The present disclosure relates to electronic assemblies, and more particularly to a method of venting/draining protective from covers in electronic assemblies.

2. Description of Related Art

Electronic assemblies, such as those used in aircraft, are commonly arranged within housings to protect electronic components from the external environment. Examples of such electronic components include controllers for flight control devices and power converters. Since such electronic components are typically arranged outside of environmentally control spaces, such housings are generally arranged to prevent dust, debris and moisture from interfering with the operation of the electronic device or devices contained within the housing.

In some electronic assemblies devices it can be necessary to vent or drain the housing interior to the external environment, for example to prevent excessive pressure differential between the housing interior and ambient environment or to expel accumulated moisture during flight. Since the pathway between the housing interior and the external environment potentially provides a channel for dust, moisture, and debris to enter the housing assembly, the pathway typically includes infiltration countermeasures. Examples of infiltration countermeasures includes valves, filters and traps. Such structures can increase the size of the housing and can add additional maintenance requirements to ensure reliable operation.

Such systems and methods have generally been satisfactory for their intended purpose. However, there is still a need in the art for improved electronics enclosures and method of venting/draining electronics enclosures. The present disclosure provides a solution to this need.

SUMMARY OF THE INVENTION

A vent/drain cover for an electronics enclosure includes a cover body defining an axis and a surface with a first wall protruding from the surface in a direction and a second wall protruding from the surface in the same direction but displaced radially from the first wall. The first wall has a first channel formed therein that is defined by a portion of the first wall that does not extend as far from the surface as the balance of the first wall. The second wall has a second channel defined by a portion of the second wall that does not extend as far from the surface as the balance of the second wall, the first channel circumferentially offset from the second channel.

In certain embodiments the cover can have a periphery. The first channel and the second channel can be in fluid communication with one another along a labyrinthine path. The labyrinthine path can be defined within the vent/drain cover to limit ingress and expel foreign material from the vent/drain cover. The first wall can include three or more first wall segments. Circumferentially adjacent first wall segments can be spaced apart by the first wall channels. The vent/drain cover can include an inner wall. The inner wall can extend axially from the cover body from a location between the axis and the first wall. The inner wall can include an annulus. The annulus can extend circumferentially about the axis. An interior of the inner wall can be fluidly isolated from the labyrinthine path.

In accordance with certain embodiments, the cover body can define a fastener channel. The fastener channel can extend along the axis. A fastener can be received in the fastener channel to fix the vent/drain cover to an enclosure. The cover body can define an alignment feature recess. The alignment feature recess can be arranged radially between the over body periphery and the first wall. An alignment feature can be seated in the cover body radially between the cover body periphery and the axis.

It is contemplated that, in accordance with certain embodiments, vent/drain cover can be coupled to an enclosure for an electronic assembly. The enclosure and cover body can be constructed from a common material. The enclosure and cover body can be constructed from different materials. Either or both the vent/drain cover and enclosure can be constructed from a metallic material, a plated composite material, or a polymeric material.

An electronic assembly includes an enclosure and a vent/drain cover as described above. The enclosure has a wall bounding an interior of the enclosure. The wall defines a vent that is in fluid communication with the enclosure interior. The vent/drain cover is sealingly coupled to the enclosure and registered to the enclosure vent/drain such that the labyrinth path within the cover body fluidly couples the vent to the vent/drain cover opening.

In certain embodiments the enclosure can have a pedestal. The vent/drain cover can be coupled to the pedestal. The vent can trace a non-labyrinthine path through the wall of the enclosure. The non-labyrinthine path can be a straight path. The vent/drain cover can be registered to the enclosure such that the vent is arranged radially between the axis and the first wall.

In accordance with certain embodiments, the vent/drain cover can include an inner wall. The vent/drain cover can be registered to the enclosure such that the vent is arranged radially between the inner wall and the first wall. The vent can have a width. The length of the labyrinth path can be greater than twice the width of the vent.

It is contemplated that an electrical device can be seated within the enclosure interior. The electrical device can be in fluid communication with the external environment through the vent and vent/drain cover opening. The cover body can define a fastener channel and an alignment feature recess. The fastener channel can extend along the axis. A fastener can extend through the fastener channel. The fastener can couple the vent/drain cover to the enclosure. The alignment feature recess can be arranged between the periphery and the first wall. An alignment feature can be seated in the alignment feature recess. The alignment feature can fix the vent/drain cover in rotation about the axis.

A method of making an electronic assembly includes seating a vent/drain cover as described above on an enclosure with an enclosure wall defining a vent/drain feature. The vent/drain cover is registered to the enclosure such that the first wall is arranged radially between the vent/drain feature and the vent/drain second channel. In certain embodiments the vent/drain cover can be registered such that the vent/drain cover opening is radially offset about the axis relative to an expected flow path of a fluid flow with entrained foreign material.

A method of venting an electronic assembly includes ingesting foreign material into a vent/drain cover as described above. The foreign material is then expelled from the vent/drain cover through the vent/drain cover opening with a vent flow traversing the labyrinthine path within the vent/drain cover.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
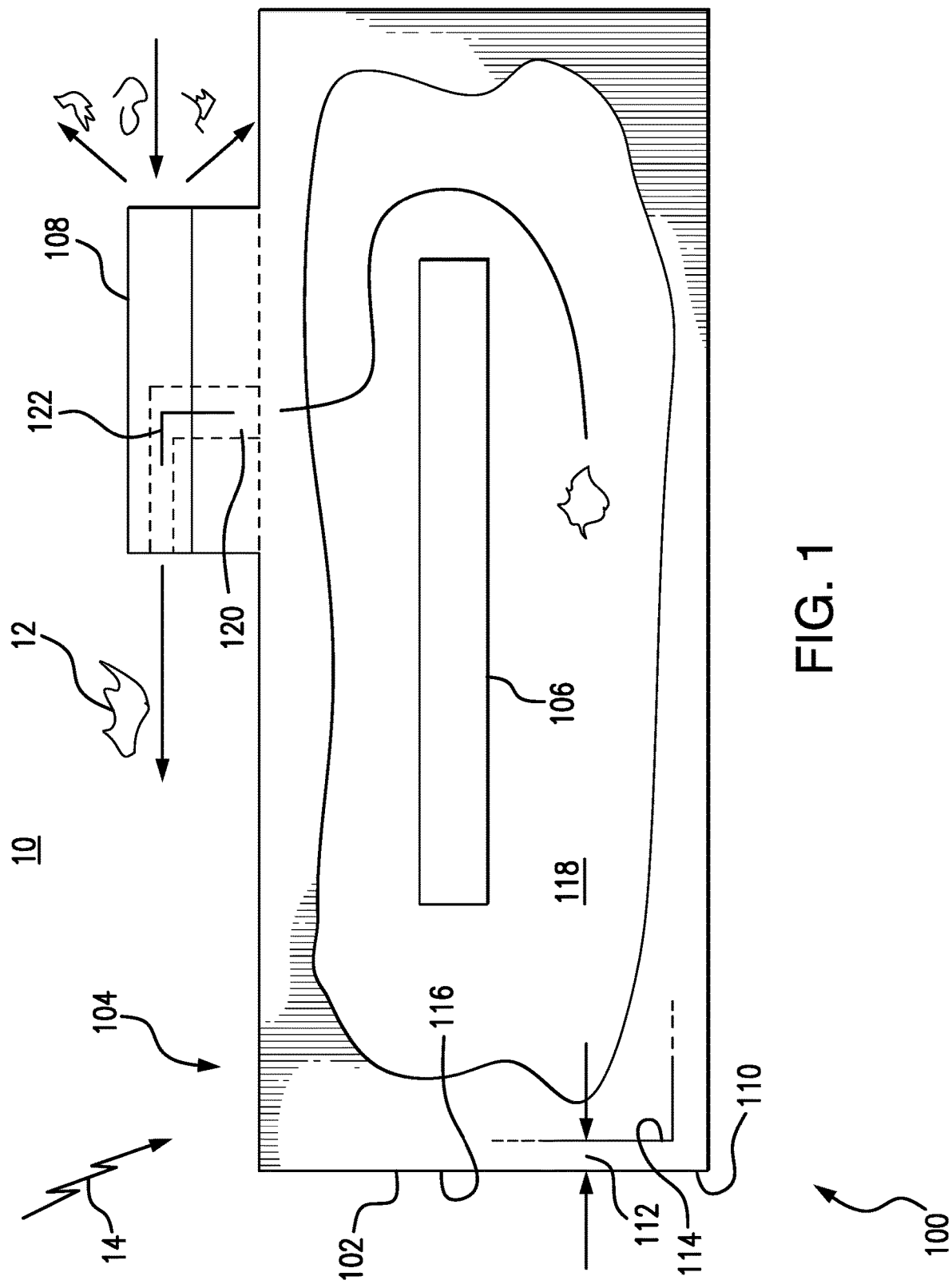
FIG. 1 is a side view of an exemplary embodiment of an electronics assembly constructed in accordance with the present disclosure, showing an enclosure vent/drain feature in fluid communication with the external environment through a vent/drain cover.

Reference will now be made to the drawings wherein like reference numerals identify similar structural features or aspects of the subject disclosure. For purposes of explanation and illustration, and not limitation, a partial view of an exemplary embodiment of a vented electronic assembly in accordance with the present disclosure is shown in FIG. 1 and is designated generally by reference character 100. Other embodiments of vented/drained electronic assemblies, vent/drain covers for vented/drained electronic assemblies, and methods of venting/draining electronic assemblies in accordance with the disclosure, or aspects thereof, are provided in FIGS. 2-8, as will be described. The systems and methods described herein can be used venting/draining electronic assemblies, such as in aircraft electrical systems, though the present disclosure is not limited to aircraft electrical systems or to electronic assemblies in general.

Referring to FIG. 1, electronic assembly 100 is shown. Electronic assembly 100 includes an enclosure 102, a cover 104, an electrical device 106, and a vent/drain cover 108. Enclosure 102 has a wall 110 with a thickness 112, an inner surface 114, and an outer surface 116. Wall 110 envelopes an interior 118 of enclosure 102, electrical device 106 being seated within interior 118. Wall 110 defines an enclosure vent/drain feature 120 which extends between enclosure inner surface 114 and enclosure outer surface 116. Vent/drain cover 108 is fixed to enclosure 102 and defines within its interior a labyrinthine path 122. Labyrinthine path 122 fluidly couples enclosure vent/drain feature 120 to the environment 10 external to enclosure 102. Enclosure vent/drain feature 120 in turn fluidly couples labyrinthine path 122, and thereby the external environment 10, to enclosure interior 118.

As will be appreciated by those of skill in the art in view of the present disclosure, electronic devices like electrical device 106 can require protection from environmental conditions that could affect the reliability of the electrical device. Examples of such environmental conditions foreign material 12, e.g., sand, dust, and rain, which can be ingested through vents in some types of electrical assemblies. Vent/drain cover 108 is configured to cooperate with enclosure vent/drain feature 120 to limit the ingress of foreign material 12 into enclosure interior 118, allow ventilation of enclosure interior 118, and facilitate egress of foreign material 12 from enclosure interior 118. It is also contemplated that, in a certain embodiments, vent/drain cover 108 provide electromagnetic shielding against electromagnetic interference (EMI) 14 which may be present in external environment 10.

Figure 2:
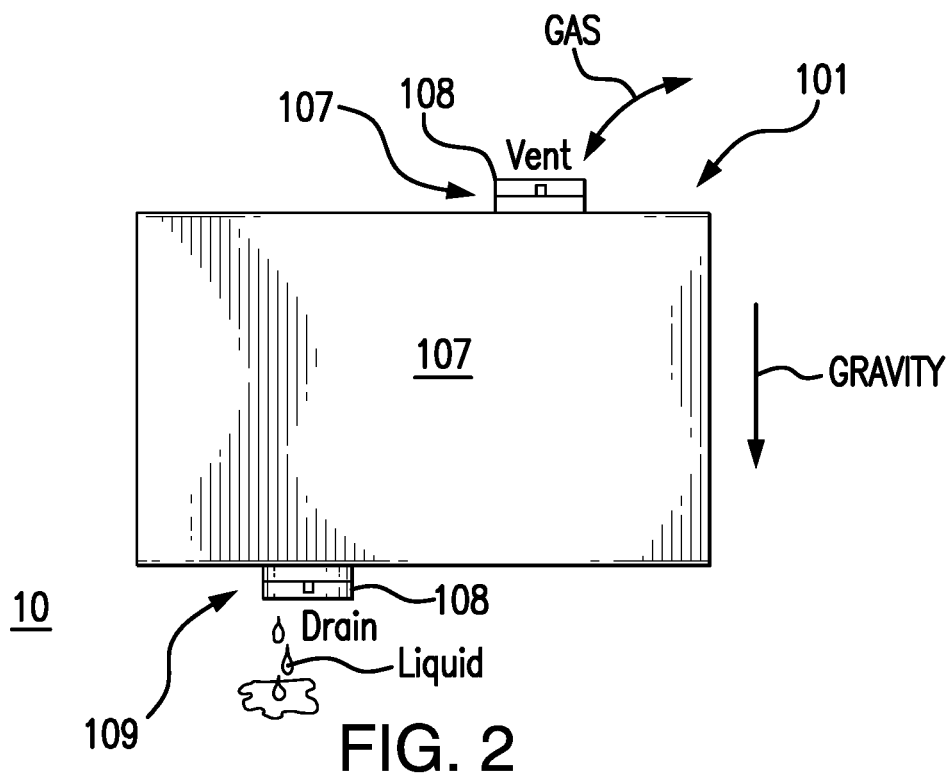
FIGS. 2 and 3 are side elevations views of embodiments of the electronics assembly of FIG. 1, showing a vent cover and a drain cover fluidly coupling an enclosure vent feature and an enclosure drain feature with the external environment, respectively.
Figure 3:
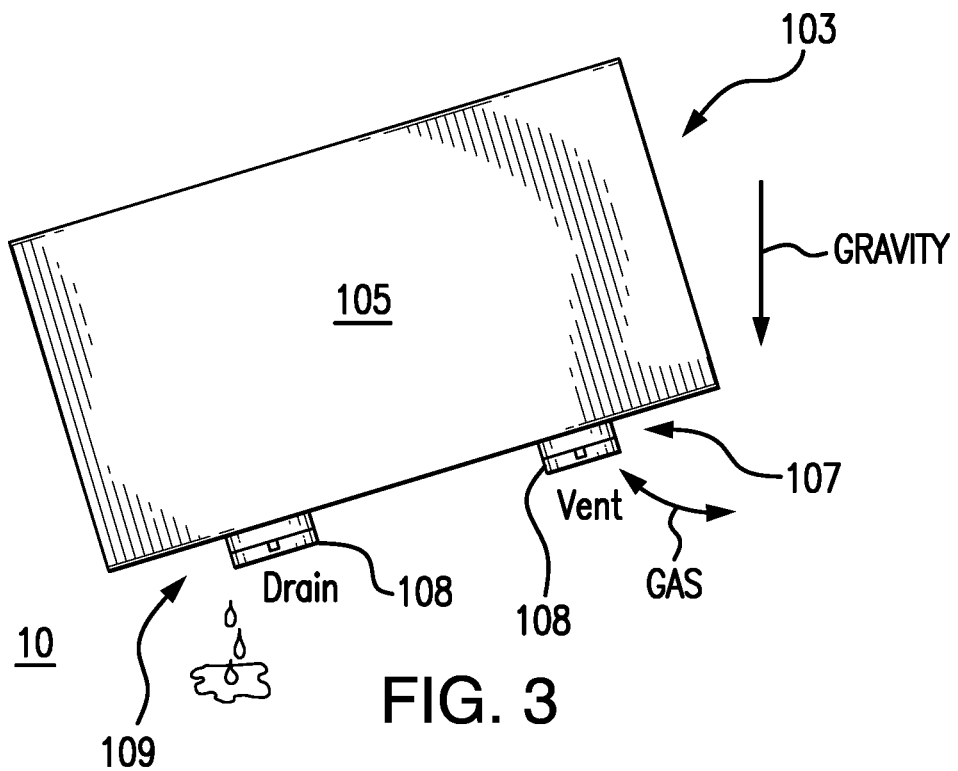

With reference to FIGS. 2 and 3, exemplary electronic assembly 101 and electronic assembly 103 are shown. It is contemplated that vent/drain cover 108 can provide protection for a vent feature, a drain feature, or both a vent feature and a drain feature on an electronic assembly. For example, as shown in FIG. 2, electronic assembly 101 can have an enclosure 105 with a vent feature 107, configured to allow gas to enter and exit enclosure 105 from the external environment 10 for pressure equalization, and a drain feature 109, configured to allow liquid to exit enclosure 105. In this respect vent feature 107 is located above drain feature 109 relative to gravity to provide fluid communication with the external environment as well as protection from foreign material 12 (shown in FIG. 1) that may be present in the external environment while drain feature 109 allows accumulated moisture to exit drain feature 109. As will be appreciated by those of skill in the art, placing the drain below the vent allows accumulated moisture to drain from the interior of enclosure 105. It is contemplated that vent feature 107 and drain feature 109 can be arranged on opposite sides of enclosure 105, as shown in FIG. 2. It is also contemplated that vent feature 107 and drain feature 109 can be arranged on a common side of enclosure 105, as shown in FIG. 3.

Figure 4:
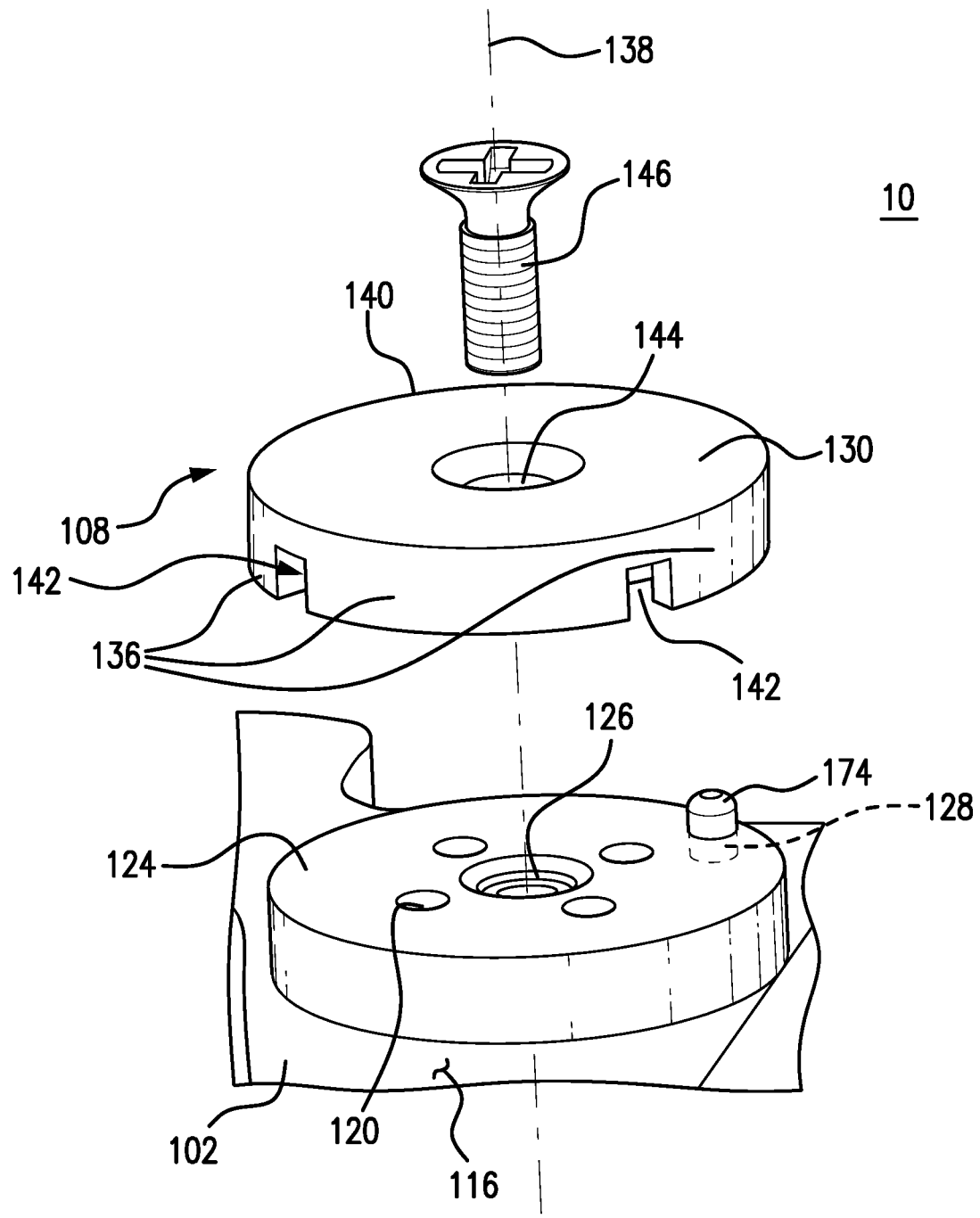
FIG. 4 is an exploded view of the electronics assembly of FIG. 1, showing the vent/drain cover exploded away from the electronics assembly enclosure.

With reference to FIG. 4, vent/drain cover 108 and a portion of enclosure 102 are shown. Enclosure 102 has a pedestal 124. Pedestal 124 extends outward from enclosure 102 and is defined by outer surface 116 on a side of inner surface 114 (shown in FIG. 1) opposite enclosure interior 118 (shown in FIG. 1). A female threaded channel 126 and an alignment feature recess 128 are defined within pedestal 124. In the illustrated exemplary embodiment female threaded channel 126 is centrally located within pedestal 124, alignment feature recess 128 is defined on the periphery of pedestal 124, and enclosure vent/drain feature 120 is defined within pedestal 124 between alignment feature recess 128 and female threaded channel 126. It is contemplated that enclosure vent/drain feature 120 can be a first vent and that one or more second vents can be defined within pedestal 124 and distributed about female threaded channel 126, as suitable for an intended application.

Vent/drain cover 108 has a cover body 130. Cover body 130 defines an axis 138 and has a surface 139 (shown in FIG. 5) with a first wall 134 (shown in FIG. 5) and a second wall 136. First wall 134 protrudes from surface 139 in a direction along axis 138. Second wall 136 protrudes from surface 139 in the same direction as first wall 134 but is displaced radially from first wall 134. First wall 134 (shown in FIG. 5) has a first channel 148 (shown in FIG. 5) formed therein that is defined by a portion of first wall 134 that does not extend as far from surface 139 as the balance of first wall 134. Second wall 136 has a second channel 142 defined by a portion second wall 136 that does not extend as far from surface 139 as the balance of second wall 136, first channel 148 being circumferentially offset from second channel 142.

Cover body 130 defines a fastener aperture 144. Fastener aperture 144 extends along axis 138 and is arranged to receive fastener 146 for coupling vent/drain cover 108 to pedestal 124. As will be appreciated by those of skill in the art in view of the present disclosure, use of a fastener allows for removal of vent/drain cover 108, such as to remove foreign material impounded within the vent/drain cover. In the illustrated exemplary embodiment fastener aperture 144 is countersunk. Countersunk fastener aperture 144 allows fastener 146 to be flush with cover body 130, reducing height of vent/drain cover 108.

Figure 5:
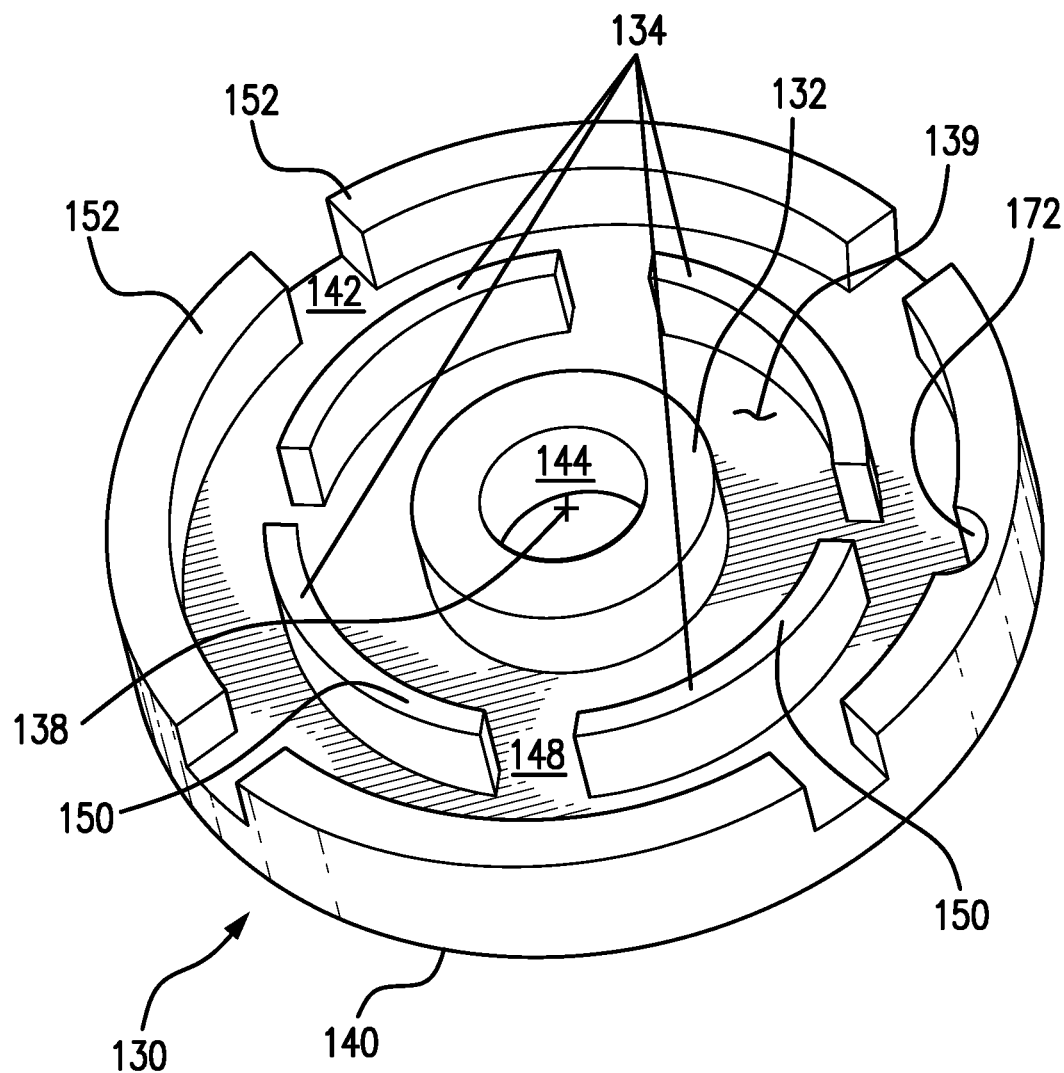
FIG. 5 is a perspective view of the vent/drain cover FIG. 1, showing an first wall arranged between an inner wall and an second wall of the vent/drain cover.

With reference to FIG. 5, a bottom view of vent/drain cover 108 is shown. First wall 134 extends circumferentially about axis 138. A plurality of first wall channels 148 extend through first wall 134, first wall channels 148 segmenting first wall 134 into a plurality of first wall segments 150, circumferentially adjacent arcuate first wall segments 150 being spaced apart from one another by first wall channels 148. In the illustrated exemplary embodiment first wall 134 has four (4) first wall segments 150 that define between one another four (4) first wall channels 148. This is for illustration purposes only and is non-limiting as it is contemplated that first wall 134 can have fewer than four (4) or more than four (4) first wall channels 148, as suitable for an intended application.

Second wall 136 is similar to first wall 134 with the difference that second wall 136 is fixed to cover body 130 at periphery 140. More particularly, second wall 136 is arranged radially outward of first wall 134, first wall 134 thereby being arranged between axis 138 and second wall 136. Second wall 136 is segmented into a plurality of second wall segments 152 having arcuate shapes. Pairs of circumferentially adjacent second wall segments 152 are arcuate segments spaced apart from one another by intervening vent/drain cover openings 142. In the illustrated exemplary embodiment second wall 136 defines four (4) vent/drain cover openings 142. This is for illustration purposes only and is non-limiting as it is contemplated that second wall 136 can have fewer than four (4) or more than four (4) vent/drain cover openings 142, as suitable for an intended application.

An inner wall 132 arranged between radially between axis 118 and first wall 134. Inner wall 132 protrudes from surface 139 in the same direction that first wall 134 protrudes from surface 139. Inner wall 132 also extends continuously about axis 118, thereby fluidly isolating fastener aperture 144 from labyrinthine path 122 when installed on enclosure 102.

Figure 6:
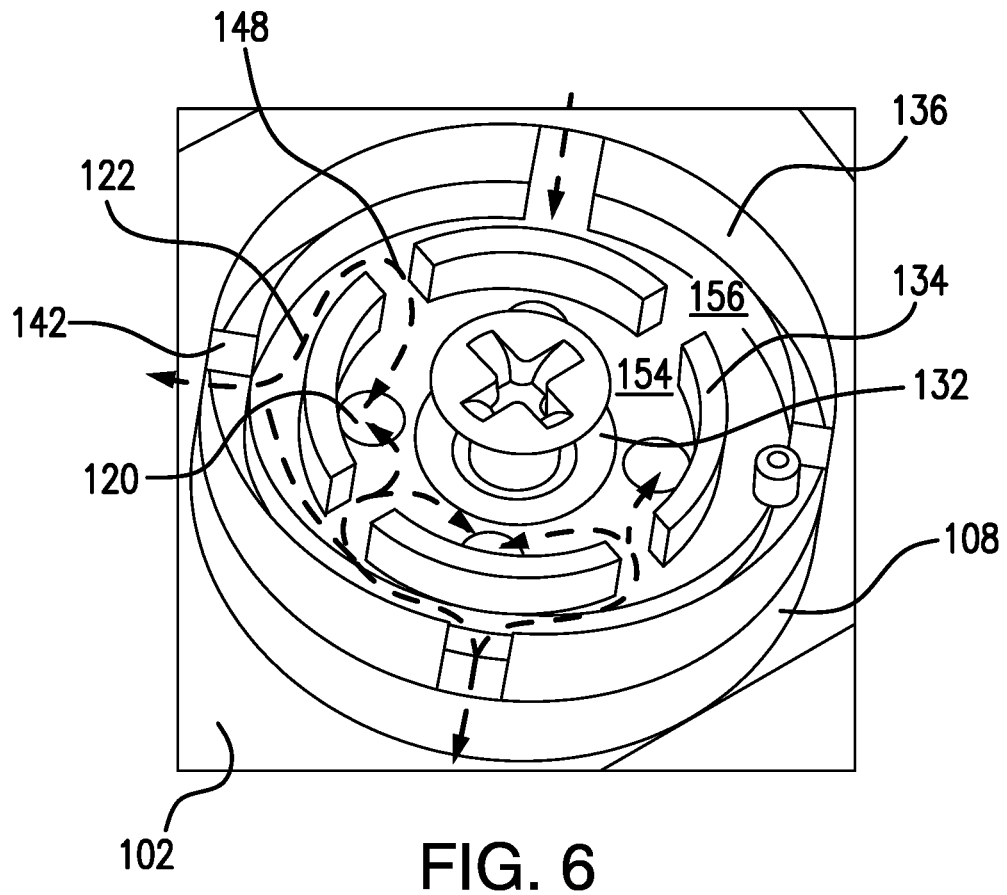
FIG. 6 is a partial perspective view of the electronics assembly of FIG. 1, showing a labyrinthine flow path defined between the enclosure vent/drain features and the openings of the vent/drain cover.

Each vent/drain cover opening 142 is radially aligned with a respective first wall segment 150 of first wall 134. More particularly, each vent/drain cover opening 142 is radially misaligned to each of the first wall channels 148 of first wall 134. As shown in FIG. 6, radial misalignment of vent/drain cover openings 142 to first wall channels 148 of first wall 134 forces fluid traversing vent/drain cover 108 to execute one or more turns within vent/drain cover 108, the turns defining labyrinthine path 122. The radial misalignment of first wall channels 148 with vent/drain cover openings 148 causes labyrinthine path 122 to have a path length that is greater than the radial distance between enclosure vent/drain feature 120 (shown in FIG. 1) and periphery 140 (shown in FIG. 4), preventing entrained debris from readily traversing labyrinthine path 122.

Vent/drain cover 108 defines an alignment feature recess 172. Alignment feature recess can be defined by a vent/drain cover opening 142, cover body 130, and/or second wall 136. It is contemplated that an alignment structure 174 (shown in FIG. 4), such a pin or stud, can be received within both vent/drain cover alignment feature recess 170 and enclosure alignment feature recess 128, alignment structure 174 cooperating with vent/drain cover alignment feature recess 170 and enclosure alignment feature recess 128 to register the location of vent/drain cover 108 about axis 118 in relation to enclosure 102. In certain embodiments the alignment is such that one (or all) of vent/drain cover openings 142 are misaligned to an expected flow path of moisture or fluid with entrained dust for an installation location of electronic assembly 100 (shown in FIG. 1).

Figure 7:
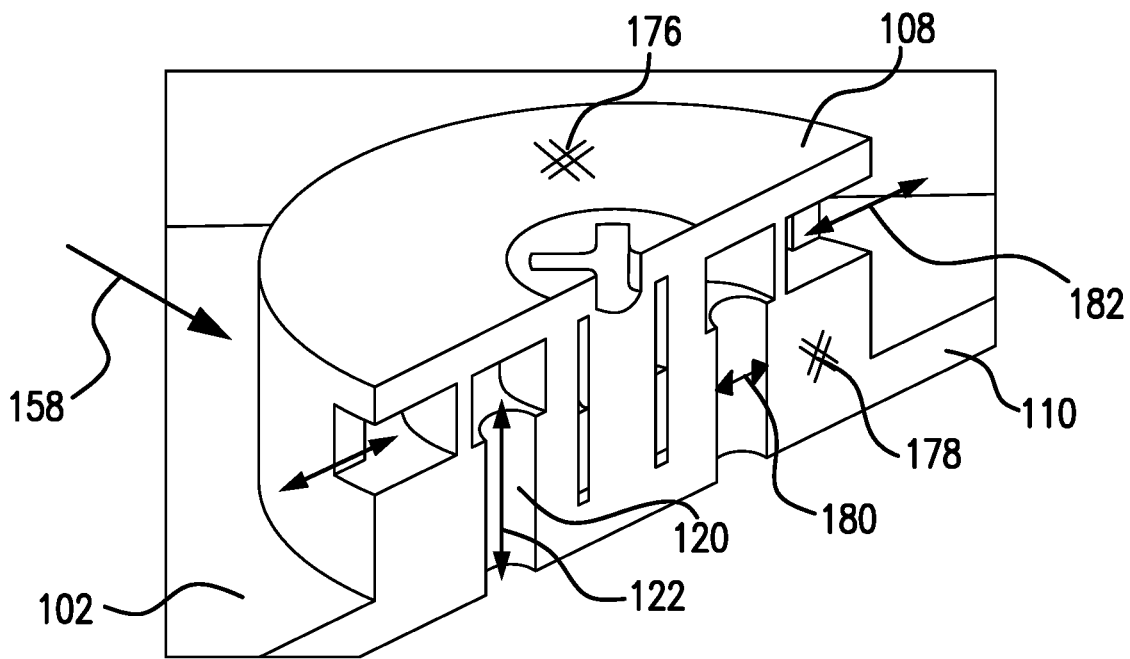
FIG. 7 is a partial cross-sectional view of the electronics assembly of FIG. 1, showing the enclosure vent/drain features radially separated from the vent/drain cover openings by the first wall.

With reference to FIGS. 6 and 7, labyrinthine path 122 is shown. Labyrinthine path 122 extends between enclosure vent/drain feature 120 and vent/drain cover opening 142. More particularly, labyrinthine path 122 extends from enclosure vent/drain feature 120 and along a portion of an inner path 154 defined between inner wall 132 and first wall 134. Labyrinthine path 122 traverses first wall 134 at first wall channel 148 and traverses a portion of outer path 156, which is defined between first wall 134 and second wall 136. From outer path 156 labyrinthine path 122 traverses second wall 136 at a vent/drain cover opening 142, labyrinthine path 122 thereby providing fluid communication between enclosure vent/drain feature 120 and vent/drain cover opening 142 through vent/drain cover 108.

As shown by the double headed flow arrows, fluid traversing vent/drain cover 108 between enclosure vent/drain features 120 and vent/drain cover openings 142 makes at least four (4) turns along labyrinthine path 122. As shown in FIG. 7, fluid traversing enclosure vent/drain feature 120 makes an initial turn at the intersection of enclosure vent/drain feature 120 and inner path 154. As shown in FIG. 7, once in inner path 154, the fluid makes a second turn to flow radially outward through first wall channel 148. From first wall channel 148 the fluid makes a third turn into outer path 156. Thereafter the fluid turns a fourth time, from the circumferential direction defined by outer path 156 to a radially outward direction to traverse second wall 136 through a vent/drain cover opening 142.

As will be appreciated by those of skill in the art in view of the present disclosure, each turn causes the fluid executing to change speed, altering the ability of the fluid to carry entrained foreign material 12 (shown in FIG. 1). As will also be appreciated by those of skill in the art in view of the present disclosure, the location of speed change changes according to whether the fluid flow is away from or towards enclosure vent/drain feature 120. Accordingly, foreign material 12 (shown in FIG. 1) entrained in fluid entering vent/drain cover 108 tends to be impounded by the fluid turns along labyrinthine path 122, and tends to be swept out fluid flowing from enclosure vent/drain feature 120 by the fluid turns along labyrinthine path 122. This allows vent/drain cover 108 to resist the entry of foreign material into enclosure interior 118 (shown in FIG. 1) and facilitate the egress of foreign material from enclosure interior 118.

It is contemplated that vent/drain cover 108 can be configured to provide EMI protection to electrical device 106 (shown in FIG. 1). For example, vent/drain cover 108 can include a metallic material 176 that has electrical conductivity suitable for suppressing EMI 14 (shown in FIG. 1), such as aluminum or aluminum alloy. Vent/drain cover 108 and enclosure 102 can be formed from a common material, a metallic material 178 of enclosure 102 and metallic material 176 of vent/drain cover 108 both including aluminum or aluminum alloy.

In certain embodiments, labyrinthine path 122 can have a path length that is greater than twice a width 180 of enclosure vent/drain feature 120 to suppress EMI 14 (shown in FIG. 1). In accordance with certain embodiments labyrinthine path 122 can be more than twice the width of enclosure vent/drain feature 120 and a distance 182 between enclosure vent/drain feature 120 can be less than twice width 180 of enclosure vent/drain feature 120, thereby providing EMI protection within a relative small footprint. As will be appreciated by those of skill in the art, this allows for enclosure vent/drain feature 120 to be constructed with a non-labyrinthine path, enclosure vent/drain feature 120 defining a straight flow passage through enclosure wall 110.

Figure 8A:
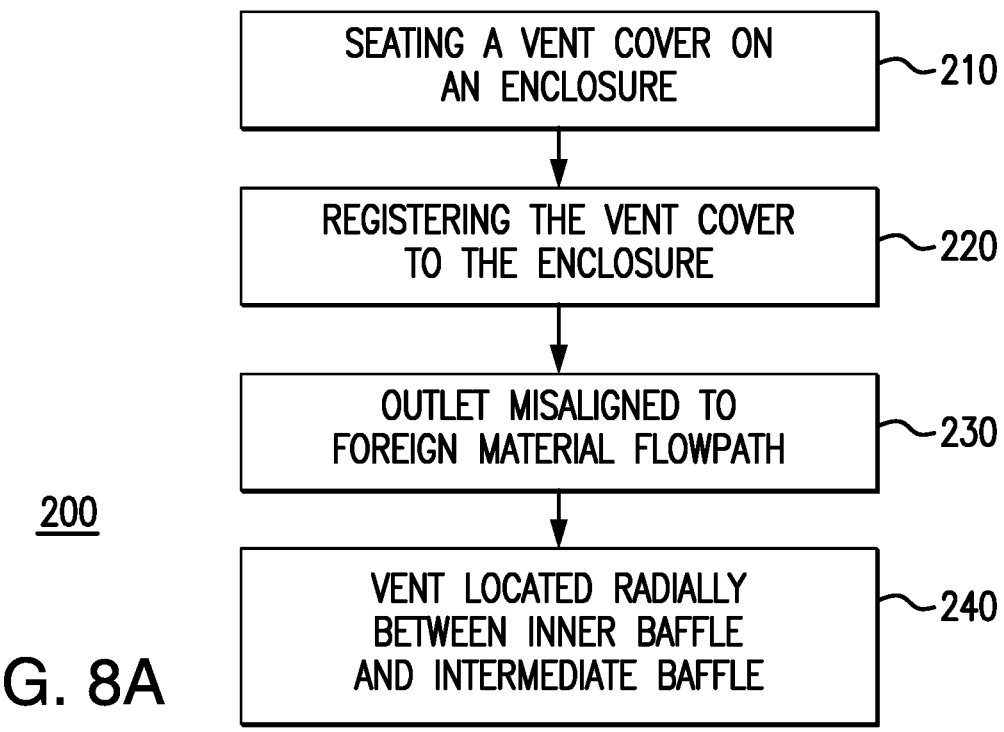
FIGS. 8A and 8B are block diagrams, respectively showing a method of making an electronic assembly and a method of venting/draining an electronic assembly, respectively.

With reference to FIG. 8A, a method 200 of making an electronic assembly, e.g., electronic assembly 100 (shown in FIG. 1), is shown. Method 200 includes seating a vent/drain cover, e.g., vent/drain cover 108 (shown in FIG. 1), to an enclosure, e.g., enclosure 102 (shown in FIG. 1), as shown with box 210. The vent/drain cover is registered to a vent, e.g., enclosure vent/drain feature 120 (shown in FIG. 1), extending through the enclosure, as shown with box 220. In certain embodiments registering the vent/drain cover to the enclosure includes orienting the vent/drain cover relative to the enclosure such that one or more vent/drain cover opening, e.g., vent/drain cover opening 142 (shown in FIG. 4), is misaligned to a foreign material flow path, e.g., flow path 158 (shown in FIG. 7), as shown with box 230. Registration can be such that each vent/drain cover opening is misaligned relative to the foreign material flow path. In accordance with certain embodiments, the vent/drain cover is registered to the enclosure such that an first wall, e.g., first wall 134 (shown in FIG. 4), is arranged radially between the vent and the vent/drain cover opening, as shown with box 240.

Figure 8B:
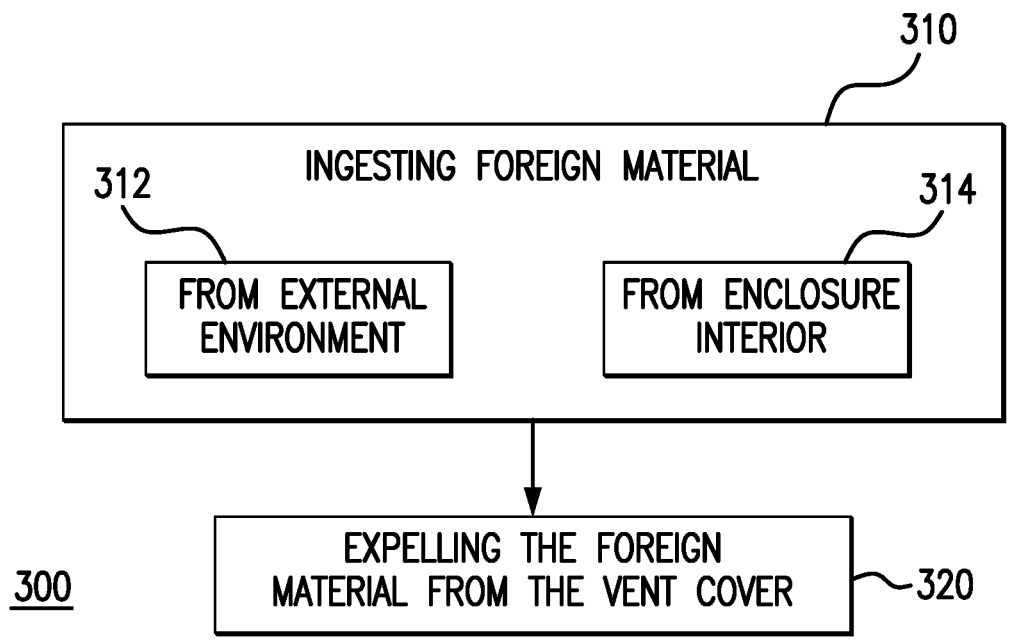

Referring to FIG. 8B, a method 300 of venting an electronic assembly, e.g., electronic assembly 100 (shown in FIG. 1), is shown. Method 300 includes ingesting foreign material, e.g., foreign material 12 (shown in FIG. 1), into a vent/drain cover, e.g., vent/drain cover 108 (shown in FIG. 1), as shown with box 310. The foreign material can be ingested from the external environment, e.g., external environment 10 (shown in FIG. 1), as shown with box 312. The foreign material can be ingested from an interior of the electronic assembly enclosure, e.g., interior 118 (shown in FIG. 1), as shown with box 320. Once ingested, the foreign material can be impounded within the vent/drain cover and along a labyrinth path within the vent/drain cover, e.g., labyrinthine path 122 (shown in FIG. 1), such as at locations where the labyrinthine path turns to traverse vent/drain cover baffles. The foreign material is thereafter expelled from the vent/drain cover, as shown with box 320.

In embodiments described herein vent/drain covers are provided for enclosure vent/drain features. In certain embodiments vent/drain covers are provided which resist the ingress of materials present in the external environment into the electronics enclosure. In accordance with certain embodiments vent/drain covers are provided that allow egress of materials from enclosure interior to the external environment. It is contemplated that, in accordance with certain embodiments, the vent/drain cover can have a low-profile, can have a universal orientation, provide electromagnetic protection, simplify vent location and the path traced by the vent through the enclosure wall, and/or have orientation keying for selection of vent opening direction relative to the enclosure and/or enclosure environment.

The methods and systems of the present disclosure, as described above and shown in the drawings, provide for vent/drain covers, electronic enclosures, and methods of venting electronic enclosures with superior properties including impeded ingestion and facilitated egress of materials from the enclosure interior. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of making an electronic assembly, comprising:
    seating a vent/drain cover with a cover body on an enclosure,
    wherein the vent/drain cover defines an axis and a surface with a first wall protruding from the surface in a direction and a second wall protruding from the surface in the same direction but displaced radially from the first wall, the first wall having first wall segments and a first channel formed between two of the first wall segments, the second wall having second wall segments and a second channel formed between two of the second wall segments, and the first channel circumferentially offset from the second channel; and
    registering the cover body to the enclosure such that the first wall is arranged radially between a vent of the enclosure and a vent/drain cover opening, wherein registering includes aligning an alignment feature recess defined in the cover body with an alignment structure defined on a pedestal of the enclosure.

2. A method of venting an electronic assembly, comprising:
    ingesting foreign material into a vent/drain cover, wherein the vent/drain cover defines an axis and a surface with a first wall protruding from the surface in a direction and a second wall protruding from the surface in the same direction but displaced radially from the first wall, the first wall having first wall segments and a first channel formed between two of the first wall segments, the second wall having second wall segments and a second channel formed between two of the second wall segments, and the first channel circumferentially offset from the second channel; and
    expelling the foreign material from the vent/drain cover using a vent flow traversing a labyrinthine path within the vent/drain cover, wherein the cover body has an inner wall protruding from the surface in the direction of the first wall, and wherein an interior of the inner wall is fluidly isolated from a labyrinthine path, wherein the labyrinthine path is at least partially defined by a portion of the inner wall, a portion of the first wall, a portion of the second wall, a portion of the at least one first channel, and a portion of the second channel.

\* \* \* \* \*